United States Patent [19]
Nadd et al.

[11] Patent Number: 5,798,538
[45] Date of Patent: Aug. 25, 1998

[54] IGBT WITH INTEGRATED CONTROL

[75] Inventors: Bruno C. Nadd, Puyvert, France; Niraj Ranjan, El Segundo, Calif.

[73] Assignee: International Rectifier Corporation, El Segundo, Calif.

[21] Appl. No.: 560,328

[22] Filed: Nov. 17, 1995

[51] Int. Cl.$^6$ .......................... H01L 29/74; H01L 23/58; H01L 31/141
[52] U.S. Cl. .......................... 257/139; 257/140; 257/488; 257/491
[58] Field of Search .......................... 257/139, 140, 257/487, 488, 491, 500, 501, 502, 503

[56] References Cited

U.S. PATENT DOCUMENTS 5,065,212  11/1991  Ohata et al. .......................... 257/500

FOREIGN PATENT DOCUMENTS

| 5-283617 | 10/1993 | Japan .......................... 257/510 |
| 2257297 | 1/1993 | United Kingdom . |
| 2261990 | 6/1993 | United Kingdom . |
| 2295052 | 5/1996 | United Kingdom . |

*Primary Examiner*—Wael Fahmy
*Attorney, Agent, or Firm*—Ostrolenk, Faber, Gerb & Soffen, LLP

[57] ABSTRACT

A monolithic IGBT and control circuit therefor are integrated into a common chip. The IGBT is formed in a first area of the chip and the control circuit is formed in a second laterally spaced area and in a P well. Means are provided to prevent hole injection from the P$^+$ substrate into the P well during IGBT operation. The means includes a sufficient spacing between the areas; a P$^+$ collection region between the areas or an N$^+$ diffusion between the areas which is connected to the P$^+$ substrate. The areas are surrounded by a common field termination structure which, however, leaves a small surface bridge between the two areas. Control conductors from the control area to the IGBT area cross over the narrow area, and not over the field terminations. A lateral PNP transistor which is integrated in the chip and is external of the IGBT area is connected to the central N$^+$ diffusion between IGBT and control areas and permits its connection to the P type substrate only when the IGBT area conducts.

39 Claims, 9 Drawing Sheets

5,798,538

1

IGBT WITH INTEGRATED CONTROL

RELATED APPLICATIONS

This application is related to copending application Ser. No. 08/121,288, filed Sep. 14, 1993 in the name of Bruno C. Nadd (IR-1016) and to copending application Ser. No. 08/298,383, filed Aug. 30, 1994 in the names of Bruno C. Nadd and Talbott M. Houk (IR-1070), both of which are assigned to the assignee of the present invention.

BACKGROUND OF THE INVENTION

This invention relates to insulated gate bipolar transistors (IGBTs), and more specifically relates to a novel monolithic semiconductor chip structure having an IGBT and control circuits therefor which are integrated into a common monolithic chip (or die).

It is well known that control circuits can be integrated into the same chip as contains a discrete power MOSFET section. Such devices are sold by the International Rectifier Corporation, the assignee of the present invention, under its trademark SMARTFET. The structure of such devices is also shown in copending application Ser. Nos. 08/121,288 (IR-1016) and 08/298,383 (IR-1070), referred to above.

Attempts to extend the above concept of a monolithically formed control circuit with a power IGBT (one which handles 1 watt or more of power) have not been successful. This is because the control circuits are contained in a "P well" or P-type diffusion in the same $N^-$ epitaxially formed layer (epi) as receives the junctions forming the IGBT. Thus, when the IGBT conducts in the forward direction, the $P^+$ substrate is forward biased relative to the $N^-$ epi so that a copious number of minority carriers (holes in the case of the N channel device being described) are injected into the $N^-$ epi. Because the P well containing the control junctions is close to the IGBT power junctions, holes are also injected under the P well. This has several consequences:

1. The P well acts as the collector of a vertical PNP transistor (with the $N^-$ epi and $P^+$ substrate). As a result, high parasitic current is injected into the P well and to ground (since the P well is usually grounded).
2. The $N^+$ source and drain diffusions in the P well act as the cathodes of vertical parasitic thyristors. The triggering of these parasitic thyristors can destroy the chip.
3. The injection of minority carriers into the P well can disturb the operation of sensitive, low power level analog circuits.

Therefore, a smart IGBT with junction-isolation has not been practical.

One attempt to overcome the problem produced by minority carrier injection has been to employ dielectric isolation of the control circuit from the main body of the chip. This structure, however, requires very expensive and very complex processing.

BRIEF DESCRIPTION OF THE INVENTION

In accordance with the present invention, a novel monolithically integrated power IGBT and control section therefor are junction-isolated, but the effect of minority carrier injection from the IGBT section to under the control section is substantially reduced.

In the following description of the invention, an N channel IGBT having an $N^+$ lateral buffer layer is described. Thus reference will be made, for convenience, to the forward bias of the $P^+$ substrate, $N^-$ epi junction. This language is intended to cover the junction to the $N^+$ buffer if such a

2 buffer is used. Moreover, the invention applies equally to P channel devices and, in general, to any MOS gated bipolar device.

In a first embodiment of the invention, the control section or P well is laterally spaced from the periphery of the active IGBT region by greater than about three diffusion lengths of the minority carrier. As a result, the $P^+$ substrate to $N^-$ epi junction will be effectively de-biased under the P well so that the concentration of minority carriers under the P well is very substantially reduced. Note, however, that the implementation of the above concept requires added silicon chip area. Further, the low sheet resistivity $N^+$ buffer layer commonly used to reduce the β of the PNP portion of the IGBT interferes with the de-bias of the $P^+$ substrate, $N^+$ buffer junction.

In accordance with a second embodiment of the invention, a further $P^+$ diffusion is placed between the control P well and the IGBT active area. The further $P^+$ diffusion is connected to the source (or cathode) electrode of the IGBT section. Consequently, most hole current outside of the active IGBT area will be diverted to the further $P^+$ diffusion and to the IGBT source electrode. Note that with this approach some hole current can still flow to under the P well.

In a third embodiment of the invention, the region between the $P^+$ substrate and $N^-$ epi and surrounding the active area is, in effect, short-circuited so that the $P^+$ substrate, $N^-$ epi junction under the control P well is fully de-biased. A preferred way to carry out this embodiment employs an $N^+$ diffusion on the upper surface of the chip and surrounding one or both the control P well or active IGBT area and the connection of the $N^+$ diffusion to the back or bottom of the chip and to the $P^+$ substrate.

Consequently, the $P^+$ substrate under the IGBT area is forward-biased relative to the $N^-$ epi (or $N^+$ buffer layer if one is used) during forward conduction. Electrons will flow laterally through the N epi or the $N^+$ buffer layer and outwardly of the active IGBT area and up to the novel $N^+$ diffusion at the upper surface of the chip. This causes a lateral voltage drop in the $N^+$ buffer layer (or $N^-$ epi) so that the $P^+$ substrate to $N^-$ epi junction is progressively de-biased, moving laterally away from under the active area. By appropriately choosing the resistance $R_s$ between the buffer layer and the new $N^+$ diffusion and the lateral resistance of the buffer layer $R_B$ such that $R_S$ is much less than $R_B$, the voltage across the $N^+/P^+$ junction under the control P well is almost zero and only negligible hole injection can occur.

In the preferred embodiment of the invention, a proper field termination is required on both sides of the $N^+$ diffusion. However, interconnections must be made from the control circuit to the IGBT, for example, source contacts, gates, Kelvin sources, current sense leads, and the like. In order to make these connections without crossing over the high voltage field termination, a novel topology is provided wherein the control section and IGBT section are enclosed by a common continuous field termination which is reentrantly bent around both sides of the $N^+$ diffusion, but leaves a narrow conductor routing-channel spaced from the end of the $N^+$ diffusion. Control conductors of metal, polysilicon or the like can be disposed over and atop this narrow routing-channel.

In the preferred embodiment of the invention, a parasitic diode is created between the main drain and source electrodes as a consequence of the use of the novel $N^+$ diffusion between control and IGBT sections. This diode prevents the

3 use of the chip in applications requiring reverse voltage blocking, and cannot be used in applications requiring an external fast recovery diode. In accordance with another feature of the invention and to overcome the effect of this parasitic diode, a novel lateral PNP transistor is integrated into the IGBT section and is connected to and enables the operation of the $N^+$ diffusion only when the IGBT is forward biased. Thus, the parasitic diode is open-circuited during those times when it could interfere with the chip operation.

Other features and advantages of the present invention will become apparent from the following description of the invention which refers to the accompanying drawings.

DETAILED DESCRIPTION OF THE DRAWINGS

Figure 1:
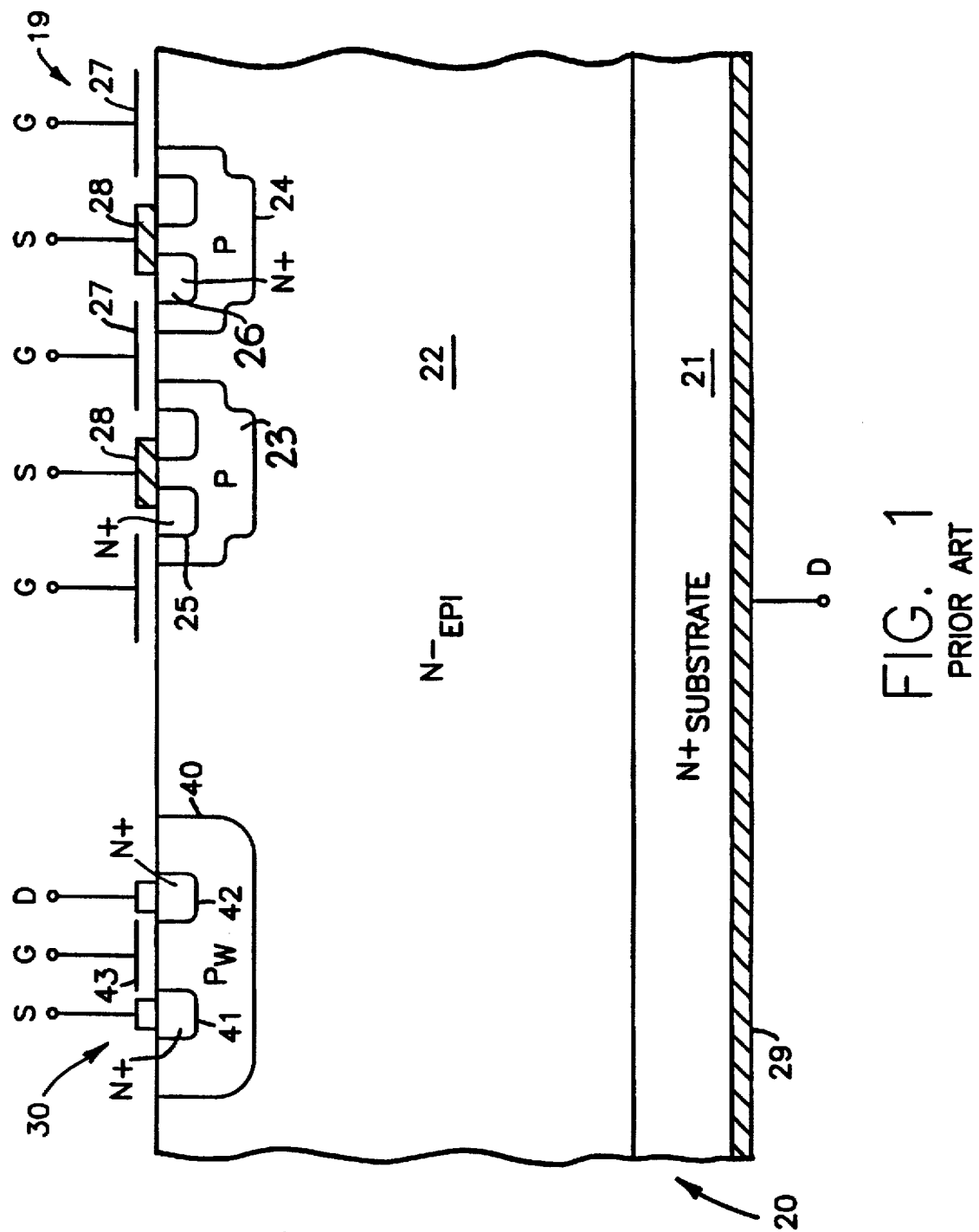
FIG. 1 shows a cross-section of a portion of a SMART-FET structure of the prior art.

Referring first to FIG. 1, there is schematically shown a small portion of a MOSFET chip of silicon 20 in cross-section. Silicon chip 20 has an $N^+$ substrate 21 and a layer 22 of epitaxial silicon which receives junctions which define the active MOSFET section 19 and its control circuit 30. Thus, the active power MOSFET section includes a plurality of P type MOSFET bases, such as bases 23 and 24, which are distributed over the active MOSFET area of chip 20 as shown in U.S. Pat. No. 5,008,725. Each of bases 23 and 24 receive respective $N^+$ annular sources 25 and 26, respec-

4 tively. A conventional polysilicon gate structure 27 overlies a conventional gate diode which covers the channel regions formed in bases 23 and 24. A main power source electrode 28 and drain electrode 29 are provided as usual.

The control section 30 is monolithically integrated into the same chip 20 with the active power MOSFET 19. Thus, a P well 40 is diffused into layer 22 and is laterally spaced from active MOSFET area 19. P well 40 contains any desired control circuitry for turning on and off the active area 19, such as, for example, thermal sensors, current sensors, undervoltage sensors and the like, such as those described in co-pending application Ser. No. 08/298,383 (IR-1070), described above. A lateral control transistor is schematically shown in FIG. 1, comprised of $N^+$ source diffusion 41, $N^+$ drain diffusion 42, and gate 43, all contained in P well 40 and junction isolated from active MOSFET area 19. The control transistor in P well 40 may then be suitably coupled to the gate 27 to effect a control of the active MOSFET in response to any desired sensed parameter. Thus, intelligence is monolithically integrated into the chip containing a power MOSFET device.

The concept of simply integrating a junction-isolated control section in an IGBT chip has created seemingly insurmountable problems. These problems are best understood from a consideration of FIG. 2 which shows the simple addition of a $P^+$ substrate 50 to the chip 20 of FIG. 1 (in place of $N^+$ substrate 21 of FIG. 1), causing it to operate as an IGBT. Note that a conventional $N^+$ buffer layer 51 may also be added in FIG. 2 in order to reduce the β of the PNP portion of the IGBT. All other components having the same numerals as FIG. 1 have the same function. Note that power section 19 will now operate in an IGBT mode due to the presence of $P^+$ region 50.

Figure 2:
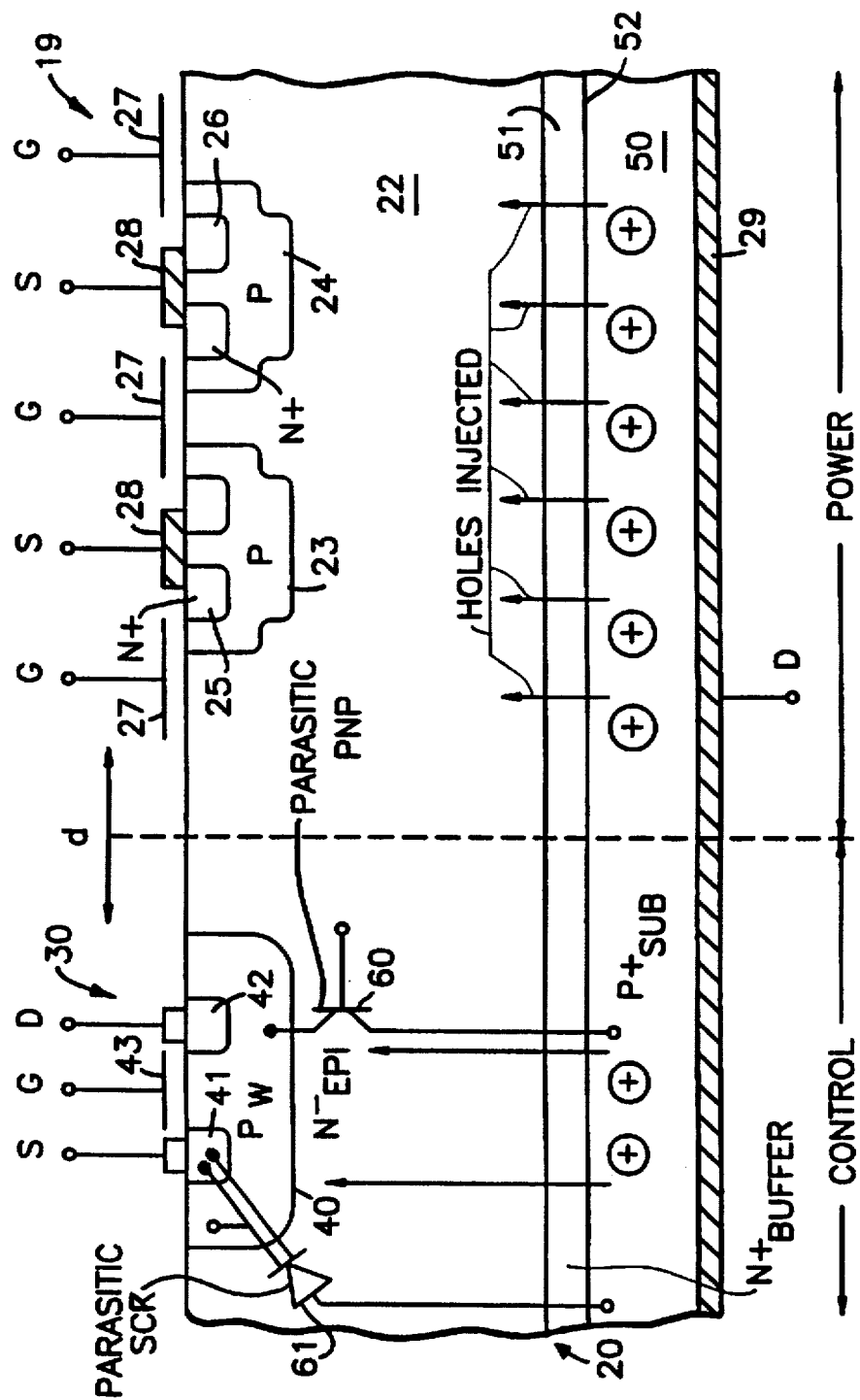
FIG. 2 shows a cross-section of a portion of an IGBT in which a P well is formed in the same chip and illustrates the problems created.

The device of FIG. 2 cannot operate satisfactorily because, during forward conduction in the IGBT mode, the junction 52 between the $P^+$ substrate 50 and $N^+$ buffer 51 (or the junction to $N^-$ epi 22 if no buffer is used) is forward biased along its length. Therefore, a copious number of minority carriers (holes in the embodiment of FIG. 2) are injected in the epi layer 22 and under P well 40. This hole injection is shown by the arrows in FIG. 2, and causes several problems:

1. The P well 40, taken with $N^-$ epi 22 and $P^+$ substrate 50 forms a parasitic PNP transistor 60. Since the P well is commonly grounded (not shown), the minority carriers in epi 22 turn the PNP transistor 60 on, causing a high parasitic current in the P well 40 to ground.

2. The $N^+$ diffusions 41 and 42 in well 40 act as the cathodes of parasitic four-layer thyristor 61. The triggering of this parasitic thyristor 61 can cause the destruction of the device.

3. The injection of minority carriers under P well 40 also will disturb the operation of the sensitive low level analog circuits which are integrated into well 40.

As a consequence of the injection of minority carriers under a junction-isolated control well, this technology has not been used to create a "SMART IGBT" analog to the "SMARTFET" device.

Figure 3:
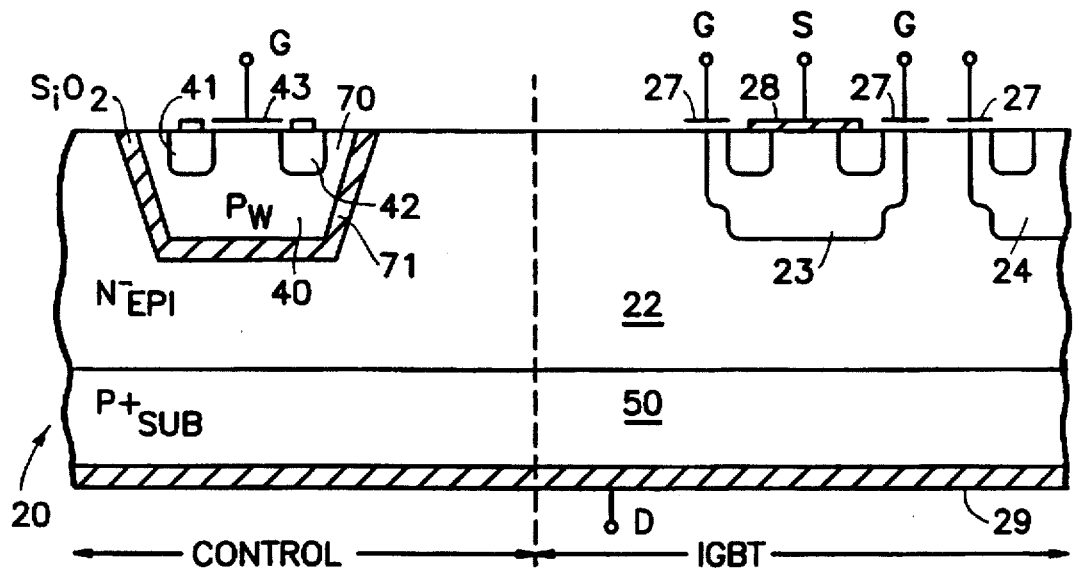
FIG. 3 shows a cross-section of a portion of an IGBT in which a control circuit is formed in a well which is dielectrically insulated from the chip.

One known structure which has avoided the minority carrier injection problem employs a dielectrically isolated P well 70, as shown in FIG. 3, which is isolated from the N epi by a silicon dioxide liner 71. In FIG. 3, parts similar to those of FIG. 2 have similar identifying numerals. This solution, however, requires very expensive and complex fabrication procedures.

The present invention achieves results similar to those of FIG. 3, but employs junction-isolation techniques which can be carried out with cost-effective fabrication.

Figure 4:
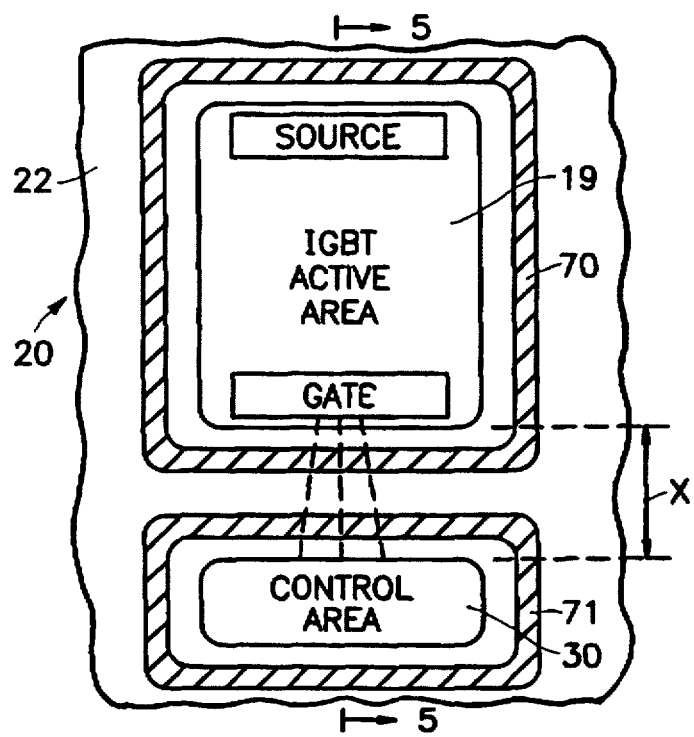
FIG. 4 shows the topology of a chip employing a first embodiment the invention.
Figure 5:
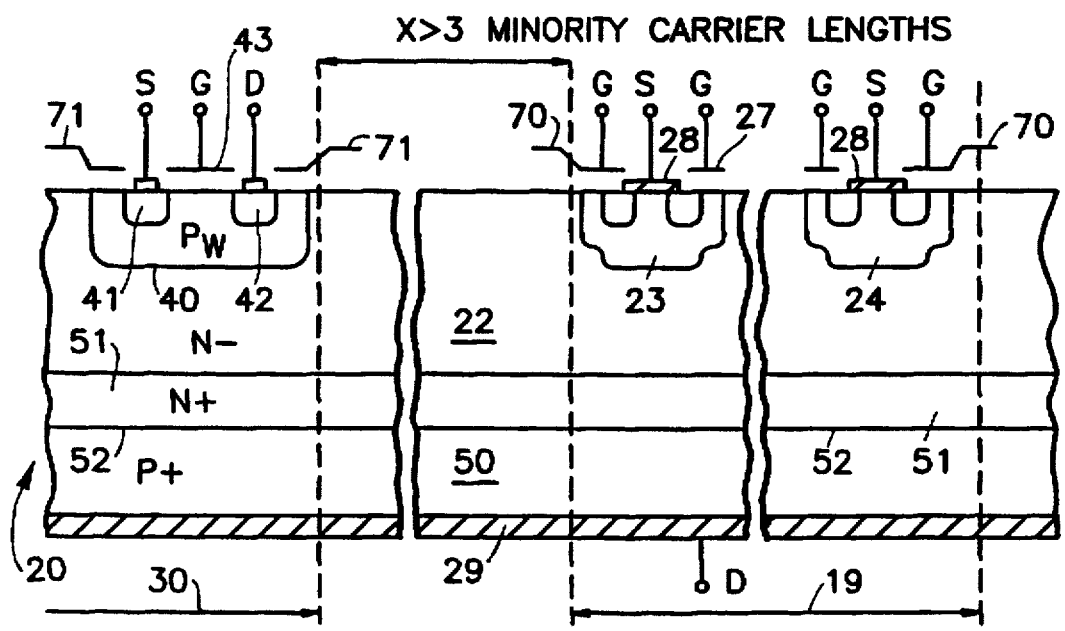
FIG. 5 shows a cross-section of FIG. 4 taken across the section lines 5—5 in FIG. 4.

In a first embodiment of the invention, the boundary of the active IGBT area in FIG. 2 is spaced by three diffusion lengths or more from the boundary of the P well 40. Thus, FIGS. 4 and 5 show one possible arrangement for this embodiment, wherein components similar to those of FIG. 2 are given similar identifying numerals. FIGS. 4 and 5 also show field terminations 70 and 71 which surround the active IGBT area 19 and the control area 30, respectively. The dotted lines 75 indicate the connection of the control circuit 30 to the gate 27 and source (and other related terminals) of the active IGBT area 19. Note that other control areas and other IGBTs or other power devices can be integrated into epi layer 22 of FIGS. 4 and 5 at areas laterally removed from area 19.

In accordance with the invention, the distance between the periphery of the P well 40 and the periphery of the active IGBT junctions is greater than about three minority carrier lengths. As a result of this spacing, junction 52 is de-biased under control section 41 and the level of minority carrier injection under the control section 40 will be much lower. Note that the sheet resistivity of the N$^+$ buffer layer can also be increased to assist in de-biasing the junction 52 or 51 under the control region 30.

Figure 6:
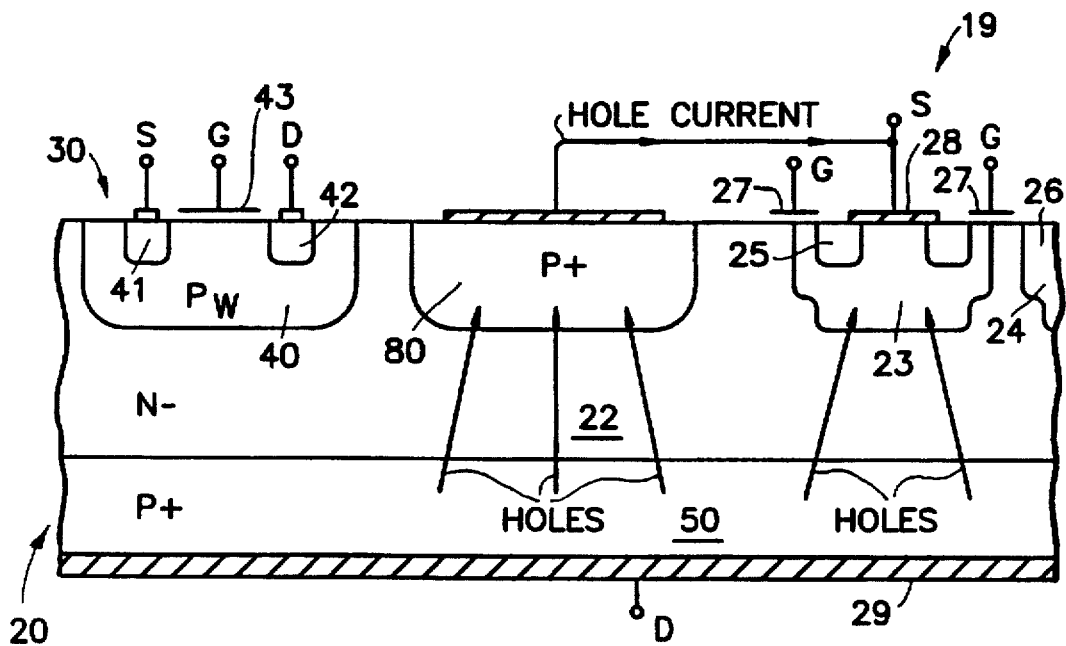
FIG. 6 shows a cross-sectional view of a portion of a SMART-IGBT chip having a $P^+$ region positioned between the active region and control region in accordance with the invention.

FIG. 6 shows a second embodiment of the invention where components similar to those of FIG. 2 have similar identifying numerals. Note that the buffer layer 21 is not shown in FIG. 6, but can be used if desired. In FIG. 6, a P$^+$ diffusion 80 is added as shown and is disposed between the control section 30 and the IGBT section 19. The P$^+$ region 80 is further connected to IGBT source electrode 28.

In operation, holes schematically shown in FIG. 6 by arrows are injected into region 22. However, the holes outside of area 19 are preferably collected by diffusion 80, so that fewer holes can be collected by P well 40.

Figure 7:
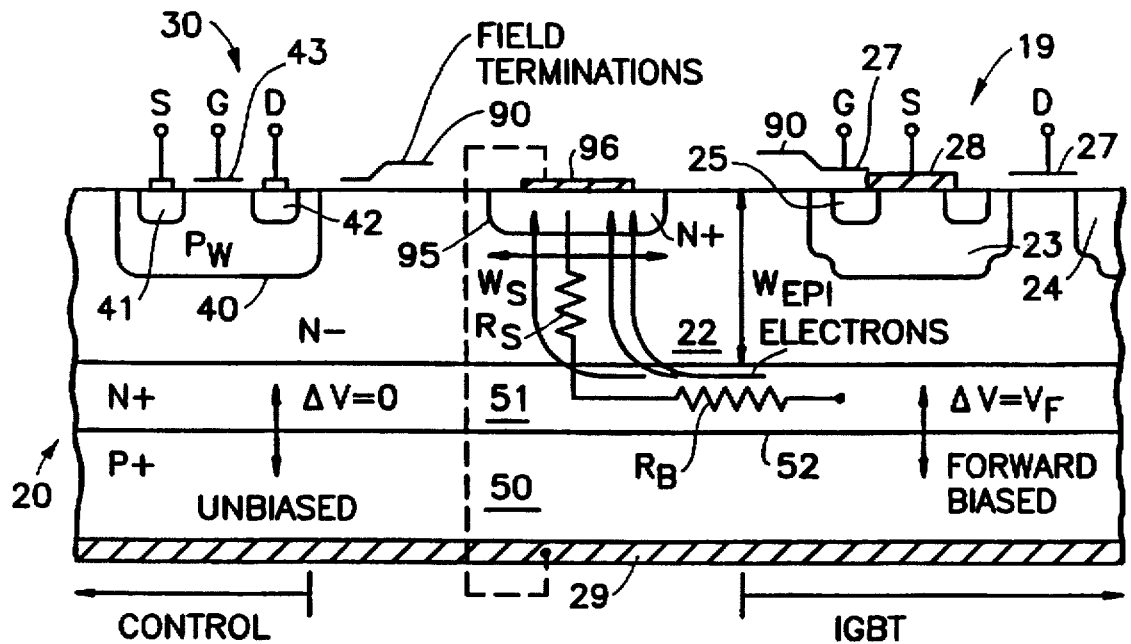
FIG. 7 shows another embodiment of the invention, employing an $N^+$ diffusion between the active IGBT area and the control area and is a cross section of FIG. 6 taken across the section lines 5—5 in FIG. 6.
Figure 8:
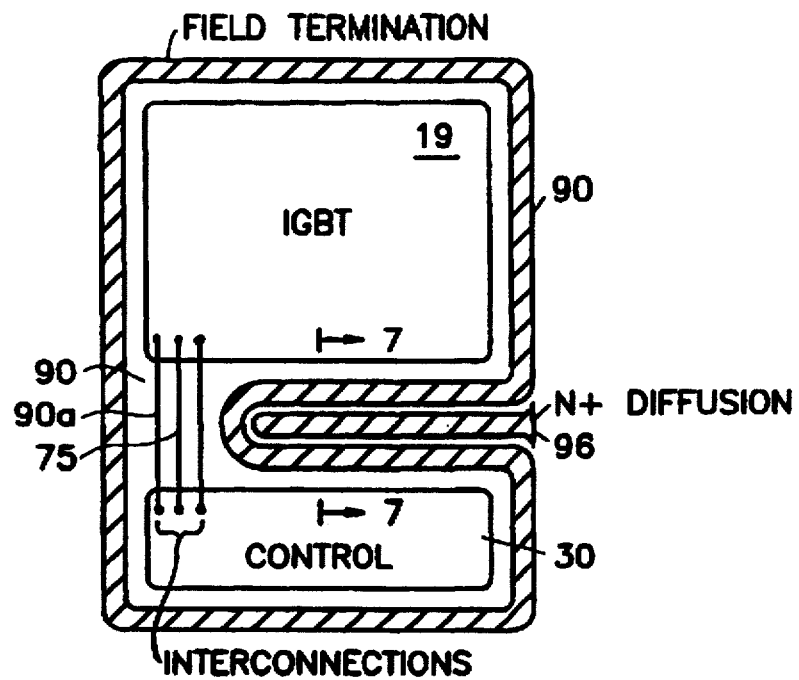
FIG. 8 shows a preferred embodiment of the topology of the active and control areas of FIG. 7.

FIGS. 7 and 8 show a still further embodiment of the invention, wherein components similar to those of prior figures have the same identifying numerals. FIG. 8 also shows a novel continuous field termination 90 which almost fully encloses each of IGBT area 19 and control area 30, leaving a narrow neck 90 over which control lead 75 can travel without crossing the high voltage field termination 90. The area between laterally spaced IGBT region 19 and control region 30 then receives an N$^+$ diffusion 95 (FIGS. 7 and 8) which is between and co-extensive with adjacent lengths of reentrantly folded termination 90. Diffusion 95 has a contact 96 which is connected to P$^+$ region 50 as shown by dotted line 97. In practice, connection 97 can be a wire-bond connection or the like. It is possible that the connection is automatically made simply by the action of a saw during wafer cutting.

The operation of the device of FIGS. 7 and 8 is as follows:

When the IGBT section 19 is conducting, junction 52 is forward biased. A lateral electron current, shown by the arrows, flows in the buffer layer 51 (or in the epi 22 if no buffer is used) and to the N$^+$ diffusion 95. This causes a lateral voltage drop along resistance R$_B$ in the buffer layer. Therefore, the junction 52 is progressively de-biased from the edge of IGBT area 19, toward control area 30. By making the resistance R$_S$ to diffusion 95 much lower than R$_B$, the voltage across junction 52 under P well 40 can be reduced to almost zero so that the level of minority carrier injection in that region is negligible. Making R$_S$<<R$_B$ can be accomplished by appropriately fixing the width W$_S$ of diffusion 95, relative to the epi layer 22 resistivity and the buffer layer 51 resistivity.

Since the control logic in control area 30 is normally referenced to the source 28 of the IGBT, a proper field termination is required on both sides of the N$^+$ diffusion 95, previously described as terminations 70 and 71 in FIGS. 4 and 5, and 90 in FIGS. 7 and 8. The interconnections of these areas by conductors 75 must pass over and be insulated from terminations 70 and 71. In the embodiment of FIG. 8, however, the IGBT 19 and control section 30 are both substantially fully enclosed by termination 90 except for the narrow surface channel or neck region 90a over which the connections 75 can be routed without crossing over termination 90. The neck region 90a is sufficiently narrow to prevent meaningful P$^+$ carrier injection from under the IGBT section 19 to under the control section 30. As previously stated, interconnections 75 can be made of metal or conductive polysilicon traces or the like over the grounded P well 40.

The connection 97 of the N$^+$ diffusion 95 to the backside of the wafer can be made with a wire bond to the lead frame (not shown) which may support the chip 20, or, if the chip is in a TO-220 type package, it can be made to the center pin, for example, of the package. In many cases, the connection will be made through the saw damaged chip edge of the chip 20, created during wafer cutting.

Figure 9:
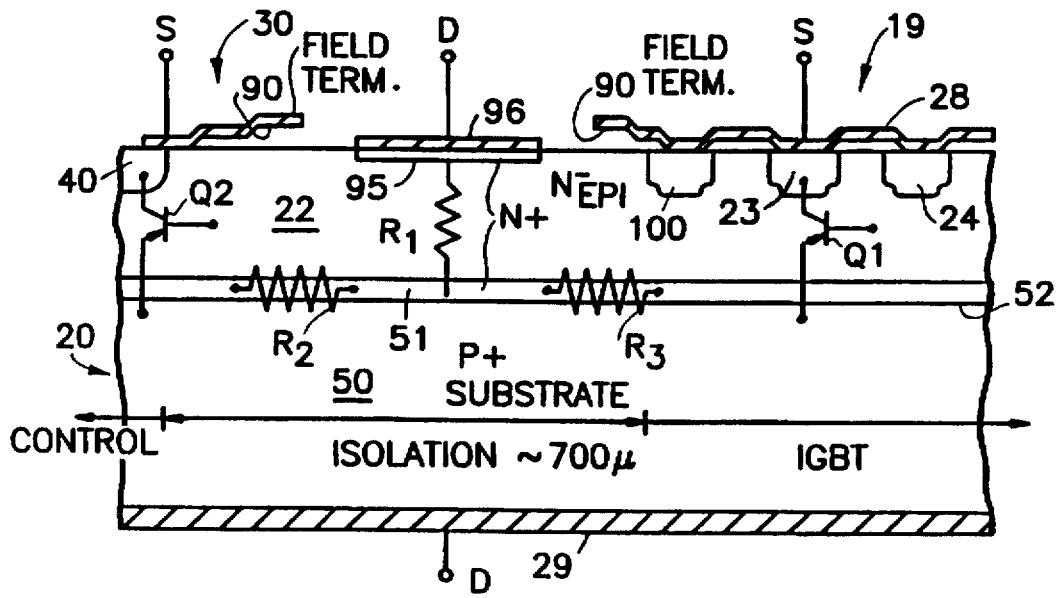
FIG. 9 shows a cross-section similar to that of FIG. 7 to more realistic scale and shows certain circuit components defined by the junctions.

FIG. 9 shows the chip 20 of FIG. 7 to a more realistic, but still schematic, scale. Parts of FIG. 9, similar to those of FIG. 7, have the same identifying numerals. Because of limitations of scale, the source and gate structures in well 40 and in bases 23 and 24 are not shown in FIG. 9. Shown, however, is an active area termination cell 100 for IGBT 19 and an intentional isolation spacing of about 700 microns between active IGBT area 19 and P well 40.

FIG. 9 next shows vertical PNP transistors Q1 and Q2 which are formed by the junctions of IGBT 19 and control area 30. It further shows the access resistance R1 between buffer layer 51 and N$^+$ diffusion 95 and resistances R2 and R3 of the buffer layer between the bottom of resistance R1 to the approximate location of the bases of PNP transistors Q2 and Q1, respectively.

Figure 10:
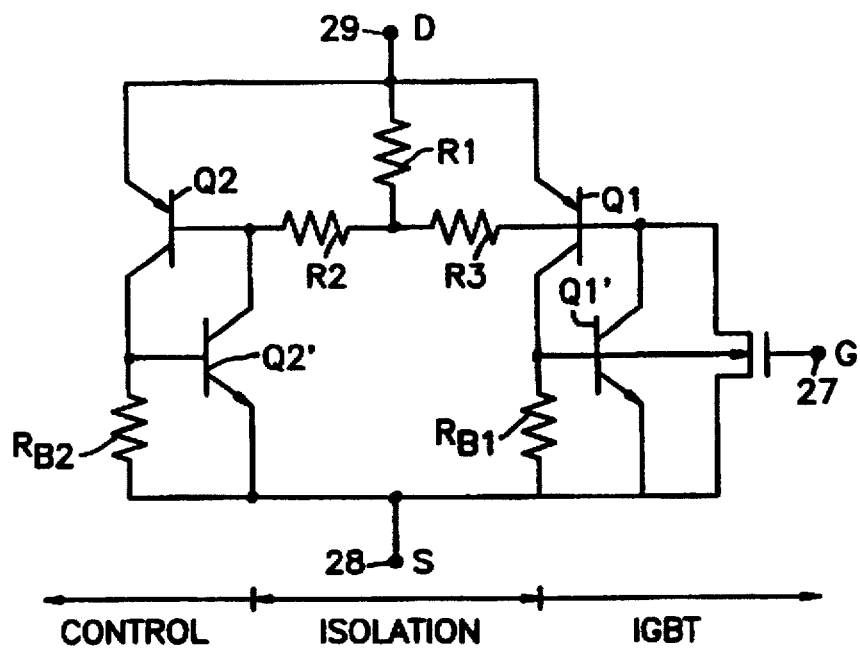
FIG. 10 is an equivalent circuit diagram of FIG. 9.

The equivalent circuit of FIG. 9 is shown in FIG. 10. FIG. 10 also shows NPN parasitic transistors Q1' and Q2' which are the parasitic NPN transistors of the N source, P base and N$^-$ epi 22 for the IGBT section 19 and the corresponding transistor of section 40, respectively. Also shown in FIG. 10 are resistors RB1 and RB2 which are the effective resistances between the base and emitter of the NPN transistors Q1' and Q2', respectively.

Under normal circumstances, transistors Q1' and Q2' should not conduct to avoid latch up of its corresponding parasitic thyristor. This is avoided in transistor Q1' by designing a very low value for resistor RB1.

However, the implementation of lateral NMOS transistors in the control section results in a much higher value for RB2 and for the gain of transistor Q2. Consequently, the control section is much more latch-up sensitive than the IGBT section and hole injection by transistor Q2 should be avoided. This is the purpose of the N$^+$ finger 95.

Figure 10A:
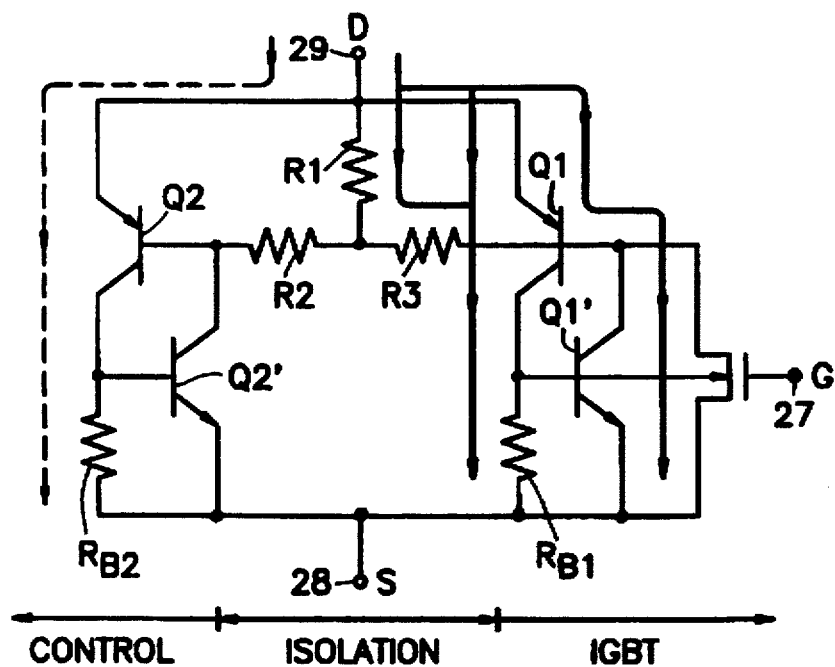
FIG. 10A shows the current in the circuit of FIG. 10 when the IGBT is forward biased.

FIG. 10A shows the currents in heavy line when the IGBT is forward biased. During forward bias, the base-emitter junction of transistor Q1 is forward biased. The base-emitter junction of transistor Q2 sees only Vbe (Q1)*R1/(R3+R1). By properly choosing the geometry (and thus the ratio R1/R3) it is possible to almost eliminate the current in transistor Q2 (see dotted line in FIG. 10A) and the risk of latch-up in the control section.

Figure 10B:
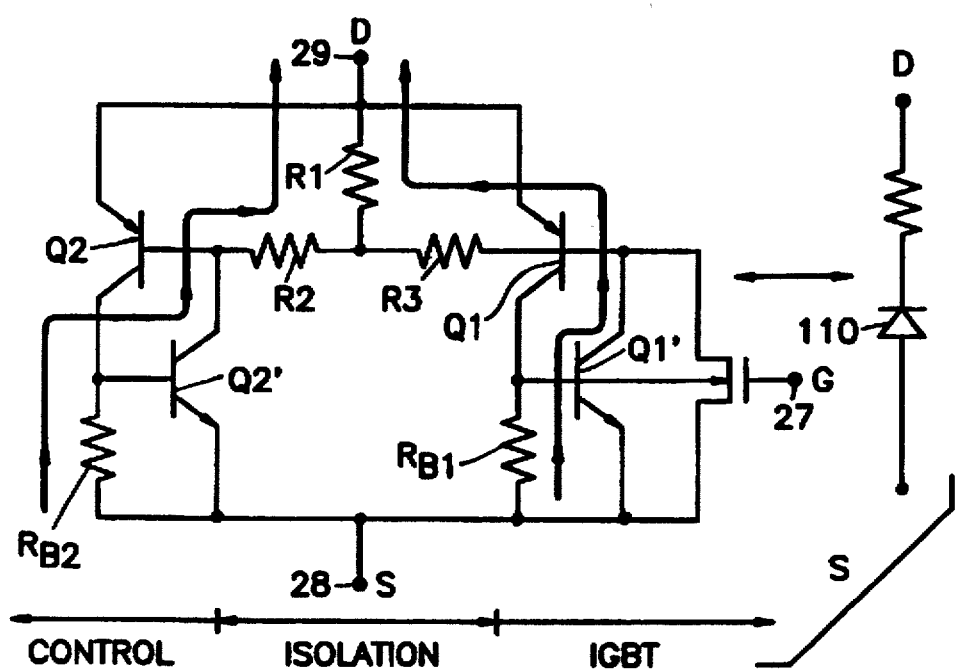
FIG. 10B shows the current paths in the circuit of FIG. 10 under reverse voltage and illustrates a parasitic diode.

This approach prevents the latch-up of the control section in the forward-biased mode. However, as shown in FIG. 10B, there is a parasitic diode 110 between the drain 29 and source 28 under reverse bias. Diode 110 consists of the base collector junctions of transistors Q1' and Q2', in series with RB1 and RB2; and R2 and R3, respectively, and R1.

This parasitic diode 110 has two damaging consequences:

1. It prohibits applications where a reverse voltage capability is necessary (such as in electronic ignition).
2. It cannot be used in applications where there is an external fast recovery diode, since the internal parasitic diode 110 will carry a part of the current diode. Diode 110 is outwardly extremely slow and its recovery current induces latch-up in the control section 30. In other words, if one re-applies a positive voltage on the drain 29 while the base/collector junction of transistor Q2' is full of minority carriers, the Q2/Q2' thyristor will latch.

Figure 11:
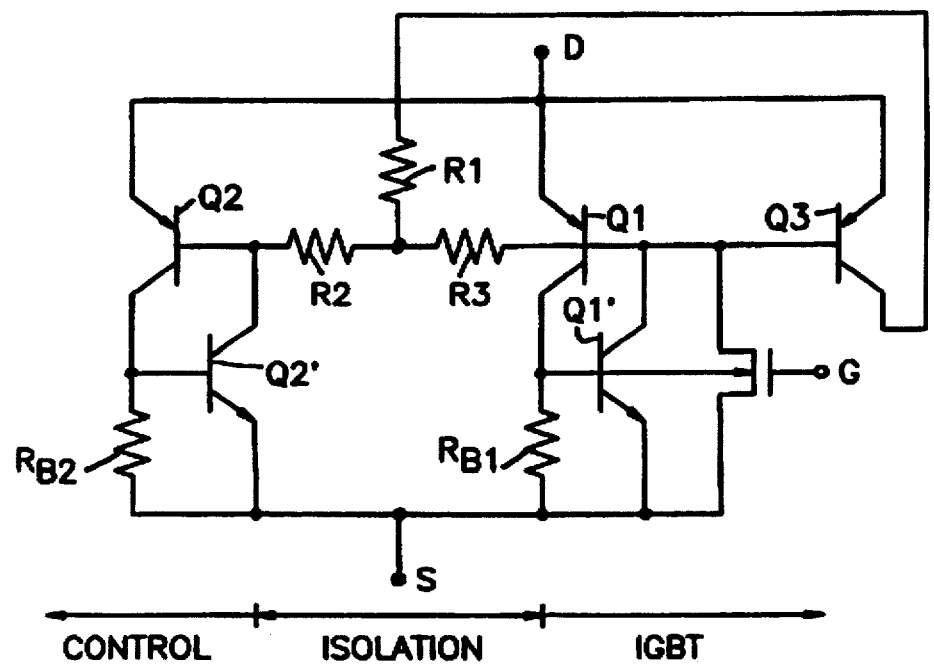
FIG. 11 shows the addition of a PNP diode to the circuit of FIG. 10 to eliminate the effect of the parasitic diode of FIG. 10B under reverse voltage.
Figure 12:
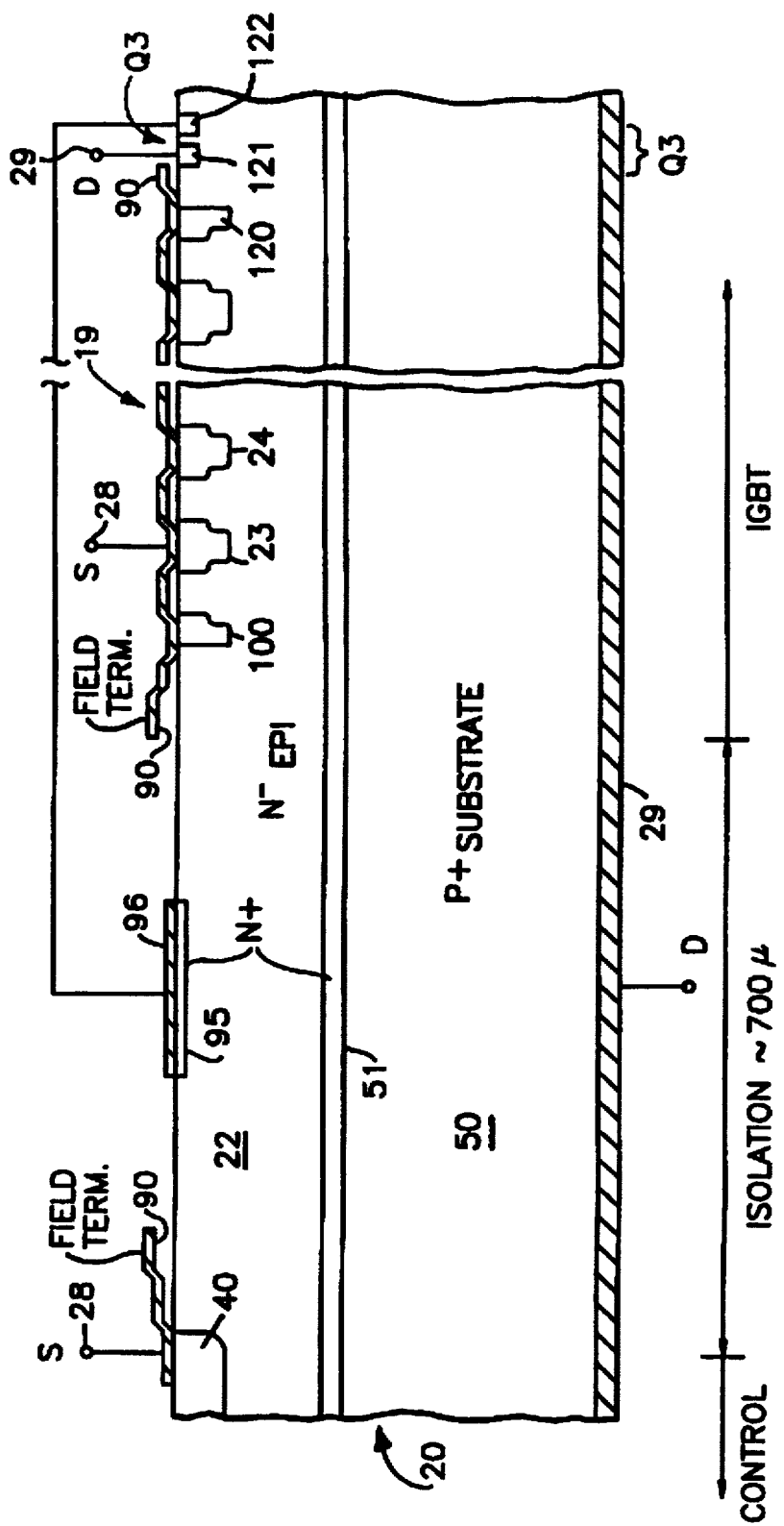
FIG. 12 shows the structure of FIG. 9 with the added PNP diode of FIG. 11 implemented therein.

As a further feature of the invention, the effect of the parasitic diode 110 is eliminated by connecting R1 of FIGS. 9, 10, 10A and 10B to the drain 29 only when the IGBT is forward biased. Thus, as shown in FIGS. 11 and 12, a lateral PNP transistor Q3 is added outside of the field termination 90 of IGBT section 19, shown from edge cell 100 to edge cell 120 in FIG. 12. The P diffusion which defines emitter 121 in FIG. 12 is connected to drain 29 as by a wire bond, and the P diffusion which defines collector 122 is connected to contact 96 of N⁺ diffusion 95.

In operation, when the IGBT 19 is forward biased, Q1 conducts and so does Q3. This dynamically connects R1 to the drain 29. When the IGBT 19 is reverse biased, Q1 and Q3 are not conducting and R1 is floating. Therefore, no reverse current flows in the structure.

Q3 can be a low voltage transistor (the same as the reverse blocking rating as the IGBT 19 itself, usually 10 to 50 V). Thus, it can be made with a narrow base (for example 10 microns) and have a high gain so that it is fully saturated when the IGBT 19 is forward biased.

Figure 13:
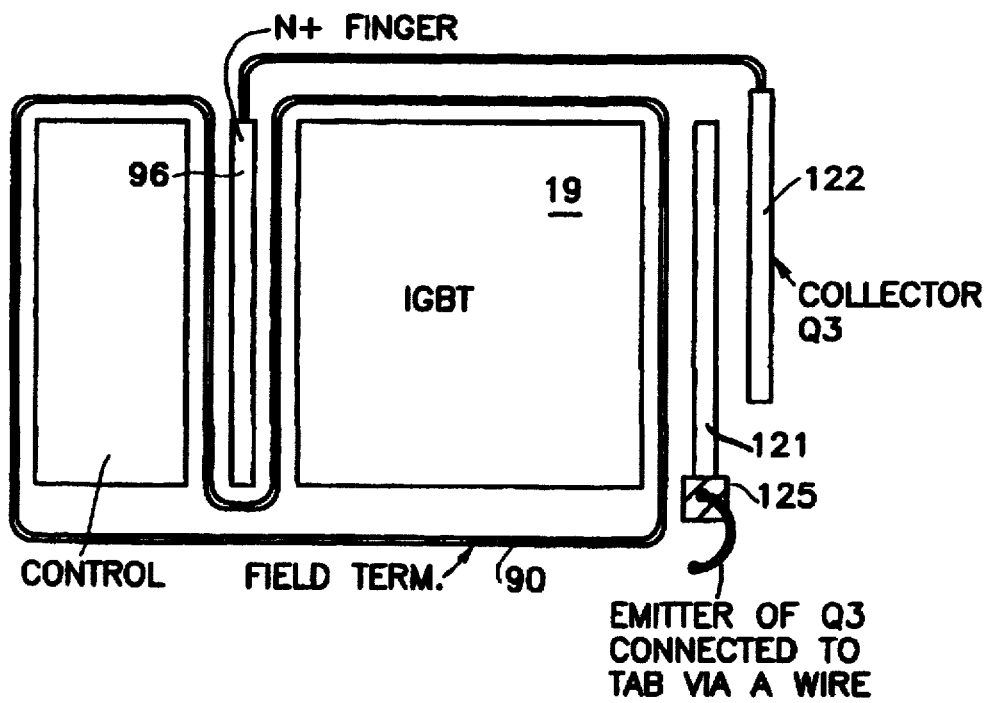
FIG. 13 shows a preferred topology for the structure of FIG. 12.

FIG. 13 schematically shows the implementation of transistor Q3 in the chip surface. Components similar to those of FIG. 8 have the same reference numerals in FIG. 13. Note that emitter and collector regions 121 and 122, respectively, are connected to a tap 125 of drain 29 and N⁺ finger 96, respectively.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An insulated gate bipolar transistor and a control circuit therefor integrated into a common semiconductor chip; said semiconductor chip having a silicon substrate having a common low concentration N type region formed on a top surface thereof and a P⁺ region on a bottom surface thereof; a first area of said common low concentration region having diffusion regions defining base, source and channel regions of an insulated gate bipolar transistor; a second area of said common low concentration region being laterally spaced from said first area; said second area including a P well diffusion and control circuit diffusions in said P well; and coupling means coupling said insulated gate bipolar transistor in said first area to said control circuit diffusions; and means disposed in at least a portion of a region of said common low concentration region located between said first and second areas for limiting the injection of holes from said P⁺ region into said P well diffusion during the injection of holes that operates said insulated gate bipolar transistor in said first area.

2. The device of claim 1 wherein said means disposed between said first and second areas includes a relatively large lateral spacing between said areas, which is at least about three diffusion lengths of holes in said low concentration N type region.

3. The device of claim 1 wherein said means disposed between said first and second areas includes a second P⁺ diffusion into the top surface of said low concentration N type region, and means connecting said second P⁺ diffusion to said source of said insulated gate bipolar transistor, whereby said second P⁺ diffusion collect holes which would otherwise be collected by said P well in said second area.

4. The device of claim 1, wherein said means disposed between said first and second areas includes an N⁺ diffusion into the top surface of said low concentration N type region; and means electrically connecting said N⁺ diffusion to said P⁺ region.

5. The device of claim 1 wherein top surfaces of said first and second areas are joined at a narrow neck region; said coupling means comprising conductors disposed atop and across said neck region.

6. The device of claim 5 which further includes field termination means disposed on a top surface of said chip, and which at least partially surrounds said first and second areas.

7. The device of claim 6 wherein said field termination means encloses opposing sides of said narrow neck region, and remaining peripheries of each of said first and second areas.

8. The device of claim 1 wherein said low concentration N type region is an epitaxially grown region.

9. The device of claim 1 which further includes a source electrode connected to said source and base regions of said insulated gate bipolar transistor, a gate electrode disposed above said channel region; and a drain electrode connected to said P⁺ region at said bottom surface.

10. The device of claim 2 wherein said low concentration N type region is an epitaxially grown region.

11. The device of claim 3 wherein said low concentration N type region is an epitaxially grown region.

12. The device of claim 4 wherein said low concentration N type region is an epitaxially grown region.

13. The device of claim 5 wherein said low concentration N type region is an epitaxially grown region.

14. The device of claim 6 wherein said low concentration N type region is an epitaxially grown region.

15. The device of claim 10 which further includes a source electrode connected to said source and base regions of said insulated gate bipolar transistor, a gate electrode disposed above said channel region; and a drain electrode connected to said P⁺ region at said bottom surface.

16. The device of claim 11 which further includes a source electrode connected to said source and base regions of said insulated gate bipolar transistor, a gate electrode disposed above said channel region; and a drain electrode connected to said P⁺ region at said bottom surface.

17. The device of claim 12 which further includes a source electrode connected to said source and base regions of said insulated gate bipolar transistor, a gate electrode disposed above said channel region; and a drain electrode connected to said P⁺ region at said bottom surface.

18. The device of claim 13 which further includes a source electrode connected to said source and base regions of said insulated gate bipolar transistor, a gate electrode disposed above said channel region; and a drain electrode connected to said P⁺ region at said bottom surface.

19. The device of claim 14 which further includes a source electrode connected to said source and base regions of said insulated gate bipolar transistor, a gate electrode disposed above said channel region; and a drain electrode connected to said P⁺ region at said bottom surface.

20. The device of claim 6, wherein said means disposed between said first and second areas includes an N⁺ diffusion into the top surface of said low concentration N type region; and means electrically connecting said N⁺ diffusion to said P⁺ region; said N⁺ diffusion being disposed between and spaced from said field termination means at locations where said field termination extends along coextensive portions of said first and second areas.

21. The device of claim 20 wherein top surfaces of said first and second areas are joined at a narrow neck regions; said coupling means comprising conductors disposed atop and across said neck region.

22. The device of claim 21 wherein said field termination encloses opposing sides of said narrow neck region, and remaining peripheries of each of said first and second areas.

23. The device of claim 22 wherein said low concentration N type region is an epitaxially grown region.

24. The device of claim 23 which further includes a source electrode connected to said source and base regions of said insulated gate bipolar transistor, a gate electrode disposed above said channel region; and a drain electrode connected to said P⁺ region at said bottom surface.

25. The device of claim 4 which further includes a lateral PNP transistor integrated into said first area and having its collector connected to said N⁺ region, its base region being the said N type region and its emitter region being connected to said P⁺ region such that it conducts only when said insulated gate bipolar transistor is forward biased such that said N⁺ region is connected to said P⁺ type substrate only when said IGBT is forward biased.

26. The device of claim 20 which further includes a lateral PNP transistor integrated into said first area and having a source region connected to said N⁺ region, and being biased to conduct only when said insulated gate bipolar transistor is forward biased such that said N⁺ region is connected to said N type substrate only when said IGBT is forward biased.

27. The device of claim 24 which further includes a lateral PNP transistor integrated into said first area and having a source region connected to said N⁺ region, and being biased to conduct only when said insulated gate bipolar transistor is forward biased such that said N⁺ region is connected to said N type substrate only when said IGBT is forward biased.

28. An IGBT and a control circuit therefor monolithically integrated into a common semiconductor chip; said semiconductor chip having a bottom P type layer and a substantially coextensive N type layer atop said P type layer; a first area of a surface of said N type layer having diffusion regions which define an IGBT; a second area of the surface of said N type layer having a P well which contains control device diffusions therein which are junction isolated from said first area; a junction between said N type layer and said P type layer extending continuously from under said first area to under said second area; and means for at least partly de-biasing said junction in the area under said control device diffusions when said IGBT area is in conduction and minority carriers are being injected from said P type layer and into said N type layer.

29. The device of claim 28 wherein said means for de-biasing comprises a lateral spacing between said first and second areas by more than about three diffusion lengths of minority carriers injected from said P layer into said N layer during forward conduction of said IGBT area.

30. The device of claim 28 wherein said first area has an IGBT source, and wherein said means comprises a P⁺ diffusion disposed into the surface of said N layer and between said first and second areas and connected to said IGBT source.

31. The device of claim 28 which further includes an N⁺ diffusion into the surface of said N layer and disposed between said first and second areas, and being connected to said P layer.

32. The device of claim 28 which further includes coupling means for coupling said control device diffusions to said diffusions which define an IGBT whereby said IGBT is operated in response to control signals from said control device diffusions.

33. The device of claim 29 which further includes coupling means for coupling said control device diffusions to said diffusions which define an IGBT whereby said IGBT is operated in response to control signals from said control device diffusions.

34. The device of claim 30 which further includes coupling means for coupling said control device diffusions to said diffusions which define an IGBT whereby said IGBT is operated in response to control signals from said control device diffusions.

35. The device of claim 31 which further includes coupling means for coupling said control device diffusions to said diffusions which define an IGBT whereby said IGBT is operated in response to control signals from said control device diffusions.

36. The device of claim 32 wherein top surfaces of said first and second areas are joined at a narrow neck region; said coupling means comprising conductors disposed atop and across said neck region.

37. The device of claim 33 wherein top surfaces of said first and second areas are joined at a narrow neck region; said coupling means comprising conductors disposed atop and across said neck region.

38. The device of claim 34 wherein top surfaces of said first and second areas are joined at a narrow neck region; said coupling means comprising conductors disposed atop and across said neck region.

39. The device of claim 35 wherein top surfaces of said first and second areas are joined at a narrow neck region; said coupling means comprising conductors disposed atop and across said neck region.

* * * * *